United States Patent
Ito et al.

(10) Patent No.: US 11,183,230 B2
(45) Date of Patent: Nov. 23, 2021

(54) SENSE AMPLIFIER CIRCUIT AND SEMICONDUCTOR MEMORY DEVICE

(71) Applicant: KIOXIA CORPORATION, Tokyo (JP)

(72) Inventors: Rui Ito, Chigasaki Kanagawa (JP); Takeshi Hioka, Tokyo (JP); Takuyo Kodama, Sagamihara Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 93 days.

(21) Appl. No.: 16/799,196

(22) Filed: Feb. 24, 2020

(65) Prior Publication Data
US 2021/0050048 A1   Feb. 18, 2021

(30) Foreign Application Priority Data
Aug. 13, 2019   (JP) .............. JP2019-148665

(51) Int. Cl.
| | | |
|---|---|---|
| G11C 16/24 | (2006.01) | |
| G11C 11/4091 | (2006.01) | |
| G11C 11/4074 | (2006.01) | |
| G11C 11/56 | (2006.01) | |
| G11C 11/4094 | (2006.01) | |

(52) U.S. Cl.
CPC ...... *G11C 11/4091* (2013.01); *G11C 11/4074* (2013.01); *G11C 11/4094* (2013.01); *G11C 11/5628* (2013.01); *G11C 11/5642* (2013.01); *G11C 16/24* (2013.01)

(58) Field of Classification Search
CPC ............................................... G11C 16/24
USPC ..................................................... 365/185.21
See application file for complete search history.

(56) References Cited

U.S. PATENT DOCUMENTS

| | | | |
|---|---|---|---|
| 7,633,809 B2 | 12/2009 | Kajiyama | |
| 9,053,805 B2 | 6/2015 | Maeda | |
| 9,087,597 B2 | 7/2015 | Maejima | |
| 9,153,335 B2 * | 10/2015 | Murakami | ............ G11C 16/24 |

* cited by examiner

*Primary Examiner* — Jason Lappas
(74) *Attorney, Agent, or Firm* — Foley & Lardner LLP

(57) ABSTRACT

According to one embodiment, a sense amplifier circuit includes an amplifier having an input terminal connected to a sense node, and a first capacitor configured to be connected in a feedback path of the amplification transistor and to a bit line of a memory cell via the sense node, the first capacitor configured to supply a current to the memory cell and integrate the current when the memory cell is read.

12 Claims, 13 Drawing Sheets

FIG. 11
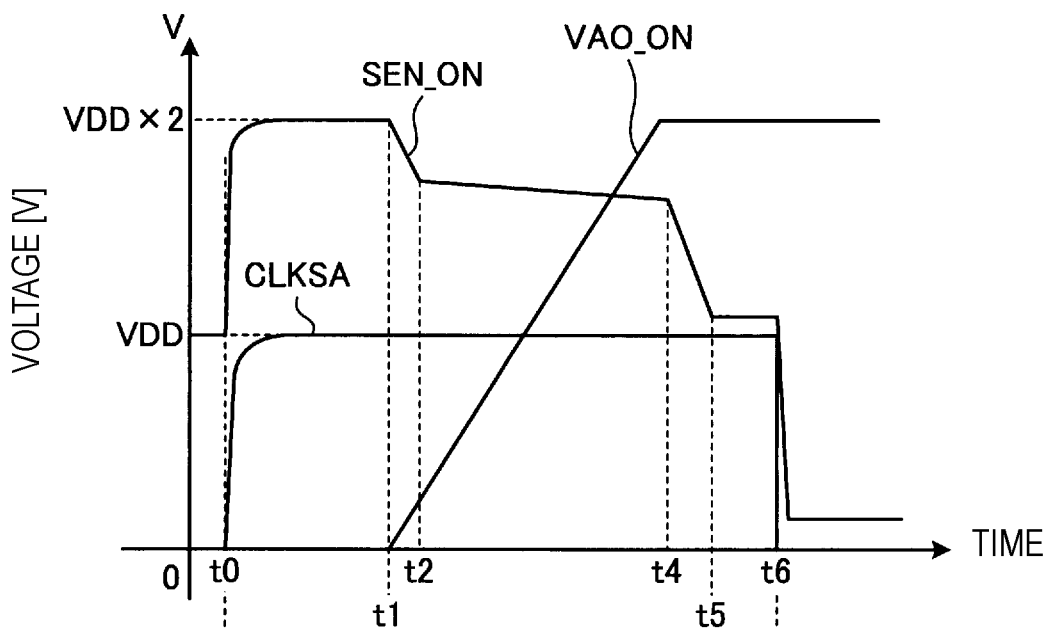
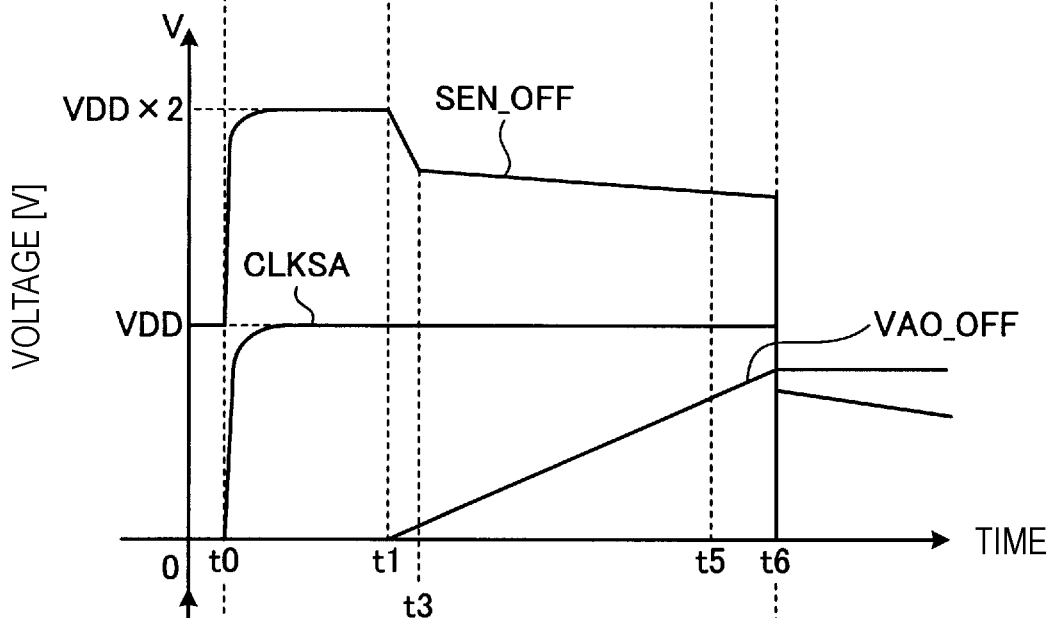
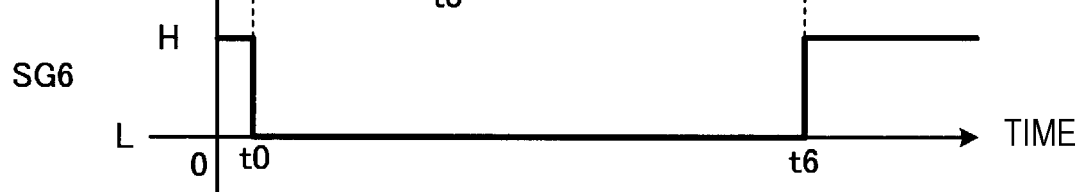

FIG. 13
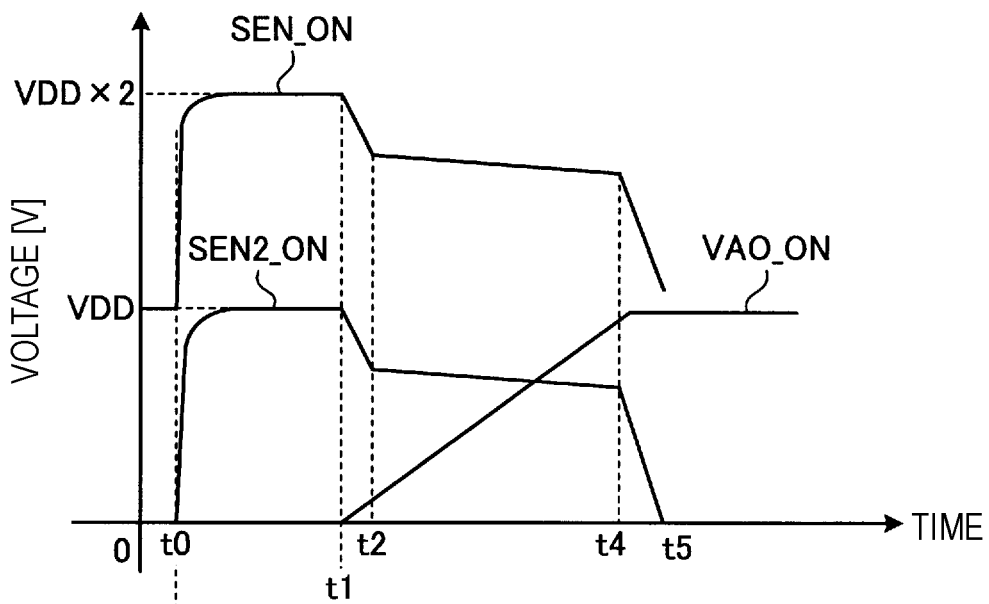
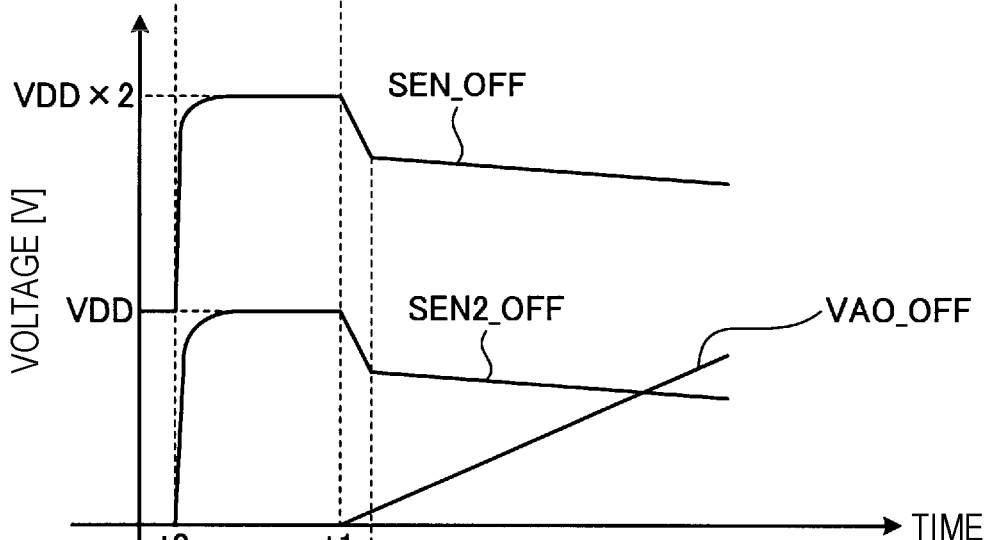
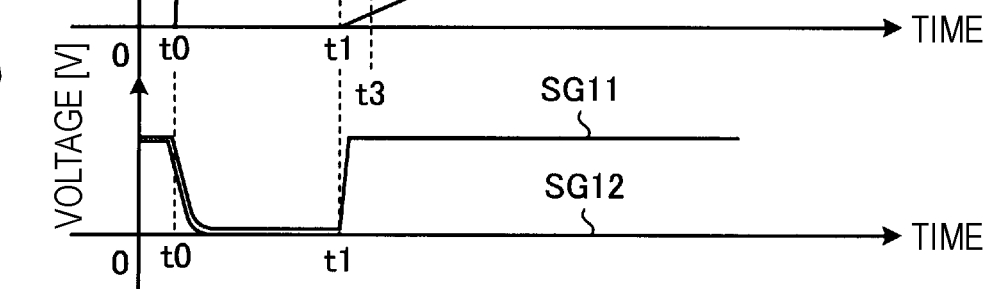

SENSE AMPLIFIER CIRCUIT AND SEMICONDUCTOR MEMORY DEVICE

CROSS-REFERENCE TO RELATED APPLICATION(S)

This application is based upon and claims the benefit of priority from Japanese Patent Application No. 2019-148665, filed on Aug. 13, 2019, the entire contents of which are incorporated herein by reference.

FIELD

Embodiments described herein relate generally to a sense amplifier circuit and a semiconductor memory device.

BACKGROUND

A semiconductor memory device having memory cell transistors (memory cells) is known. Values of data stored in the memory cells are determined according to a threshold voltage corresponding to the data values in read operation.

When data are read from a target memory cell, a read voltage corresponding to a reference threshold voltage is applied to a word line connected to the target memory cell, and a threshold voltage corresponding to the data value stored in each memory cell is determined by determining whether a current flows based on output of a sense amplifier circuit connected to the target memory cell.

As the reference threshold voltage, the threshold voltage corresponding to the data value stored in each memory cell needs to be determined by using three voltages in a case of memory cell of MLC (4-level writing), seven voltages in a case of memory cell of TLC (8-level writing), and fifteen voltages in a case of memory cell of QLC (16-level writing).

As the number of reference threshold voltages increases, the number of times of determination on the threshold voltage corresponding to the data value stored in each memory cell increases, which results in increase in the entire read time. Further, when a read time at one reference threshold voltage is shortened, it is susceptible to an operation variation of a circuit for determining whether the memory cell is on or off.

DESCRIPTION OF THE DRAWINGS

FIG. 11 is an operation explanatory diagram of the sense amplifier circuit according to the second embodiment.

FIG. 13 is an operation explanatory diagram of the sense amplifier circuit according to the third embodiment.

DETAILED DESCRIPTION

Embodiments provide a sense amplifier circuit and a semiconductor memory device capable of reducing the influence of the operation variation of a circuit for determining whether a memory cell is on or off.

In general, according to one embodiment, a sense amplifier circuit includes an amplifier having an input terminal connected to a sense node, and a first capacitor configured to be connected in a feedback path of the amplification transistor and to a bit line of a memory cell via the sense node, the first capacitor configured to supply a current to the memory cell and integrate the current when the memory cell is read.

Hereinafter, a sense amplifier circuit and a semiconductor memory device according to embodiments will be described in detail with reference to the drawings.

[1] First Embodiment

Figure 1:
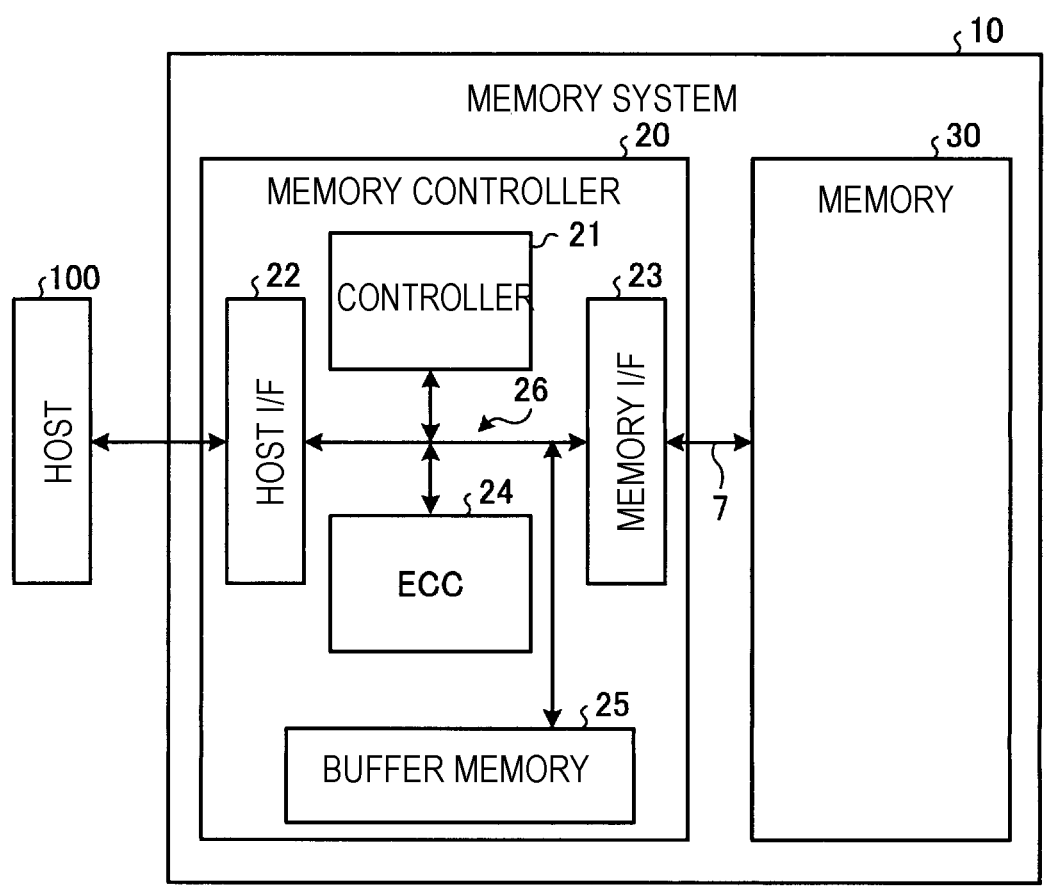
FIG. 1 is a diagram illustrating an example of a memory system including a semiconductor memory device according to a first embodiment.

FIG. 1 is a diagram illustrating an example of a memory system 10 including a semiconductor memory device according to a first embodiment.

A memory system 10 is communicably connected to a host 100 and functions as an external storage medium for the host 100.

For example, the host 100 is configured as an information processing apparatus such as a server or a personal computer, or a mobile information processing apparatus such as a smartphone or a tablet type portable terminal.

The memory system 10 includes a memory controller 20 and a memory 30.

The memory controller 20 controls the memory 30 in response to a request (command or the like) from the host 100 or autonomously. The memory 30 is an example of the semiconductor memory device according to the first embodiment.

The memory controller 20 and the memory 30 are connected by a channel 7.

The channel 7 includes I/O signal lines and control signal lines. The I/O signal lines are signal lines for transmitting and receiving, for example, data, an address, or a command.

The command includes a program command for instructing program operation, a read command for instructing a read operation, and an erase command for instructing an erase operation. The control signal lines are signal lines for transmitting and receiving, for example, a write enable signal WE, a read enable signal RE, a command latch enable signal CLE, an address latch enable signal ALE, a write protect signal WP, a data strobe signal DQS, and the like.

The memory controller 20 includes a controller 21, a host I/F (interface) 22, a memory I/F 23, an error correction circuit (ECC) 24 and a buffer memory 25, which are connected to communicate with each other via a bus 26.

In the above configuration, the controller 21 is configured as, for example, a central processor unit (CPU) or a microprocessor unit (MPU), and is a circuit that generally controls each unit in the memory controller 20.

The host I/F 22 performs a communication interface operation with the host 100.

The memory I/F 23 performs a communication interface operation with the memory 30 to transmit and receive addresses, data and commands.

The ECC 24 performs an error correction process on data read from the memory 30.

The buffer memory 25 buffers data and instructions delivered to/from the memory 30 and is used as a work area by the controller 21.

Here, the memory controller 20 may be implemented, for example, by a SoC (System-On-a-Chip). Alternatively, the memory controller 20 may be implemented by a plurality of chips.

Further, the memory controller 20 may be implemented by an FPGA (Field-Programmable Gate Array) or an ASIC (Application Specific Integrated Circuit) instead of the CPU or the MPU. That is, the memory controller 20 may be implemented by software, hardware, or a combination thereof.

Figure 2:
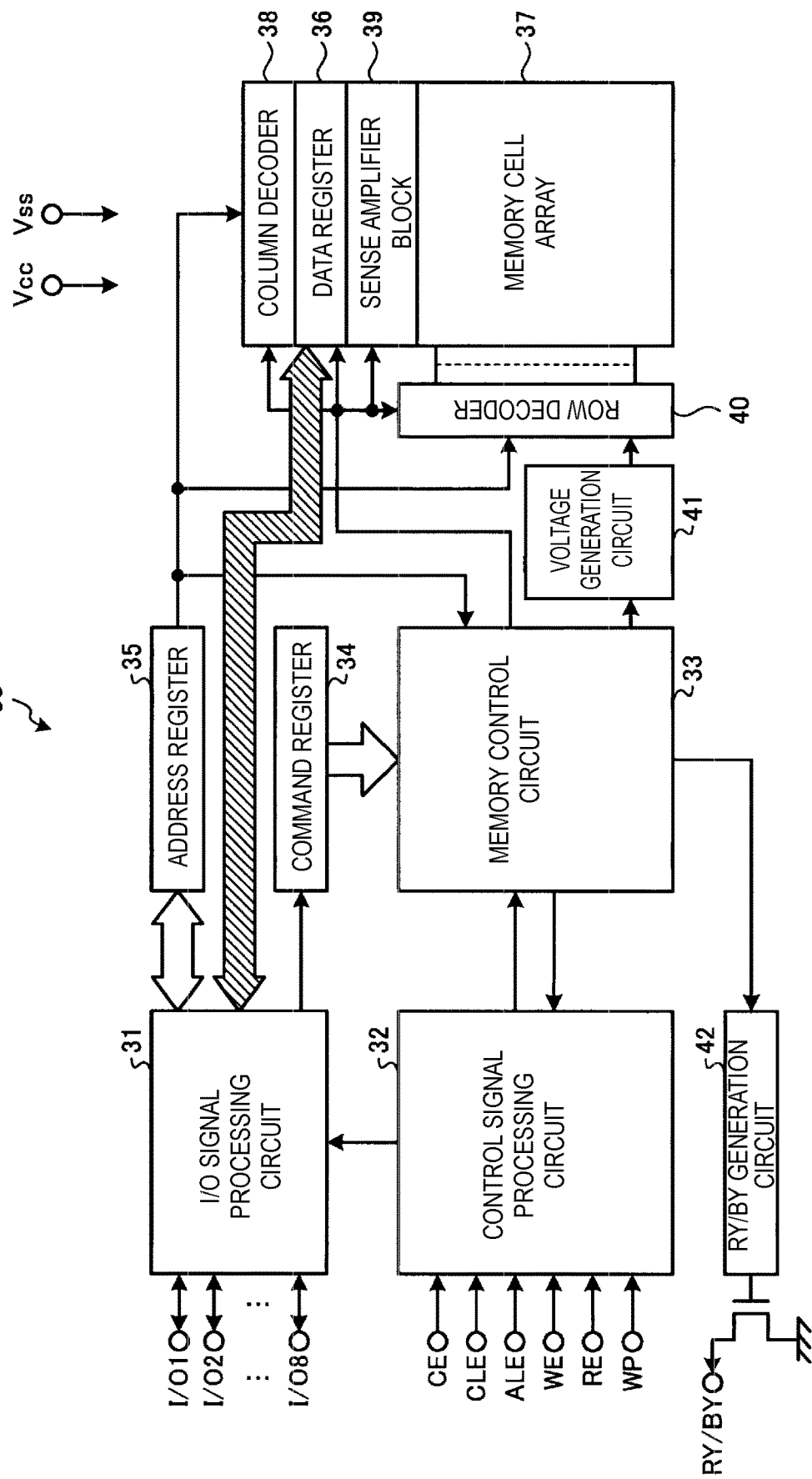
FIG. 2 is a diagram illustrating an example of a configuration of the semiconductor memory device according to the first embodiment.

FIG. 2 is a diagram illustrating an example of a configuration of the memory 30 as the semiconductor memory device according to the first embodiment.

The memory 30 includes an I/O signal processing circuit 31, a control signal processing circuit 32, a memory control circuit 33, a command register 34, an address register 35, a data register 36, a memory cell array 37, a column decoder 38, a sense amplifier block 39, a row decoder 40, a voltage generation circuit 41, and an RY/BY generation circuit 42.

The I/O signal processing circuit 31 is a circuit that performs an interface operation including a buffer operation for exchanging an I/O signal with the memory controller 20 via the I/O signal lines.

The I/O signal processing circuit 31 receives a command, an address, or data via the I/O signal lines, stores the command in the command register 34, stores the address in the address register 35, and stores the data in the data register 36, or reads data from the data register 36.

The control signal processing circuit 32 receives input of various control signals, and performs distribution of storage destination registers of the I/O signals received by the I/O signal processing circuit 31, based on the received control signal.

The memory control circuit 33 is a state machine that makes a state transition based on the various control signals received via the control signal processing circuit 32, and controls plural operations of the memory 30. For example, the memory control circuit 33 controls an access (program operation, read (sense) operation, erase operation, etc.) to the memory cell array 37 by issuing commands for controlling an operation voltage, an operation timing, and the like to the row decoder 40, the column decoder 38, the sense amplifier block 39, and the voltage generation circuit 41.

The command register 34 stores a command to be processed. The address register 35 stores an address to be processed.

The data register 36 stores data to be processed.

Here, the memory cell array 37 and the sense amplifier block 39 will be described in detail.

Figure 3:
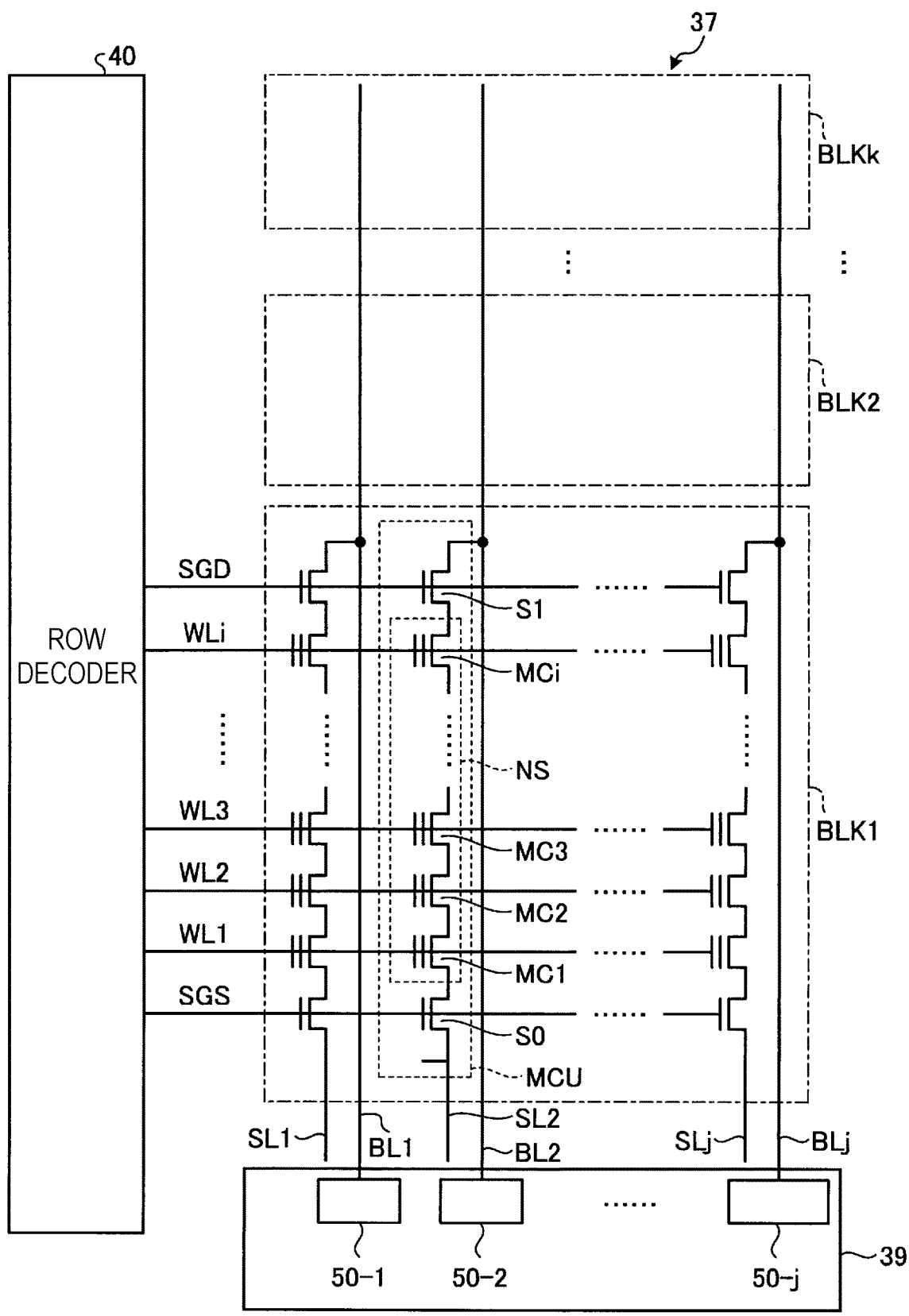
FIG. 3 is an explanatory diagram of an example of a configuration of a memory cell array and a sense amplifier block.

FIG. 3 is an explanatory diagram of an example of the configuration of the memory cell array 37 and the sense amplifier block 39.

The memory cell array 37 illustrated in FIG. 3 includes k (k is an integer of 1 or more) blocks BLK (BLK1 to BLKk). Data stored in one block BLK may be erased in a batch. Since the k blocks BLK have the same configuration, a configuration of the block BLK1 will be described below as an example.

In the block BLK1, a memory cell unit MCU includes a NAND string NS including i (i is an integer of 1 or more) memory cells (memory cell transistors) MC1 to MCi connected in series and select gate transistors S0 and S1 connected respectively to both ends of the NAND string NS.

The source of the select gate transistor S0 is connected to a source line SL (SL1 to SLj), and the drains of the select gate transistors S1 are respectively connected to bit lines BL (BL1 to BLj).

The sense amplifier block 39 includes j sense amplifier circuits 50-1 to 50-j corresponding respectively to the j bit lines BL1 to BLj. Each bit line BL is connected to the corresponding sense amplifier circuit 50.

The gate of the select gate transistor S0 is connected to a select gate line SGS, and the gate of the select gate transistor S1 is connected to a select gate line SGD. Here, the select gate lines SGS and SGD are used for selection of bit lines.

The control gates of the memory cells MC1 to MCi are respectively connected to word lines WL (WL1 to WLi). That is, the control gate electrodes of the memory cells MC in the same row in the block are connected to the same word line WL.

When each memory cell MC is configured to be able to store a 1-bit value, j memory cells MC connected to the same word line WL are handled as one page, and program operation and read operation are performed for each page.

When each memory cell MC is configured to be able to store values of a plurality of bits, for example, when each memory cell MC may store values of n bits (n: an integer of 2 or more), the storage capacity per word line WL (storage capacity for one page) is 2n times the storage capacity when each memory cell MC may store a 1-bit value. Even in this case, program operation and read operation are performed for each page.

Referring back to FIG. 2, the column decoder 38 selects a bit line to be selected from the bit lines BL1 to BLj of the memory cell array 37 based on the address data stored in the address register 35.

The voltage generation circuit 41 is supplied with a ground voltage Vss and a power supply voltage Vcc from the outside. The voltage generation circuit 41 generates a voltage to be supplied to each circuit based on these voltages and a command from the memory control circuit 33.

The address stored in the address register 35 includes a row address and a column address. The row address is transferred to and stored in the row decoder 40, and the column address is transferred to and stored in the column decoder 38.

In the program operation, the row decoder 40 selects a word line WL based on the row address. Meanwhile, the column decoder 38 selects a bit line BL based on the column address.

As a result, a programming pulse is applied via the row decoder 40 from a select word line WLsel to a select target memory cell MC (denoted as a select memory cell MCsel) located at the intersection of the word line WL selected by the row decoder 40 (denoted as a select word line WLsel) and the bit line BL selected by the column decoder 38 (denoted as a select bit line BLsel).

By the application of the programming pulse, for example, in the case of QLC type storing a 4-bit value in one memory cell MC, the threshold voltage of the memory cell MC is set to a state according to the data stored in the data register 36 among 16 states.

Here, an example of a relationship between a threshold voltage and a state will be described.

Figure 4:
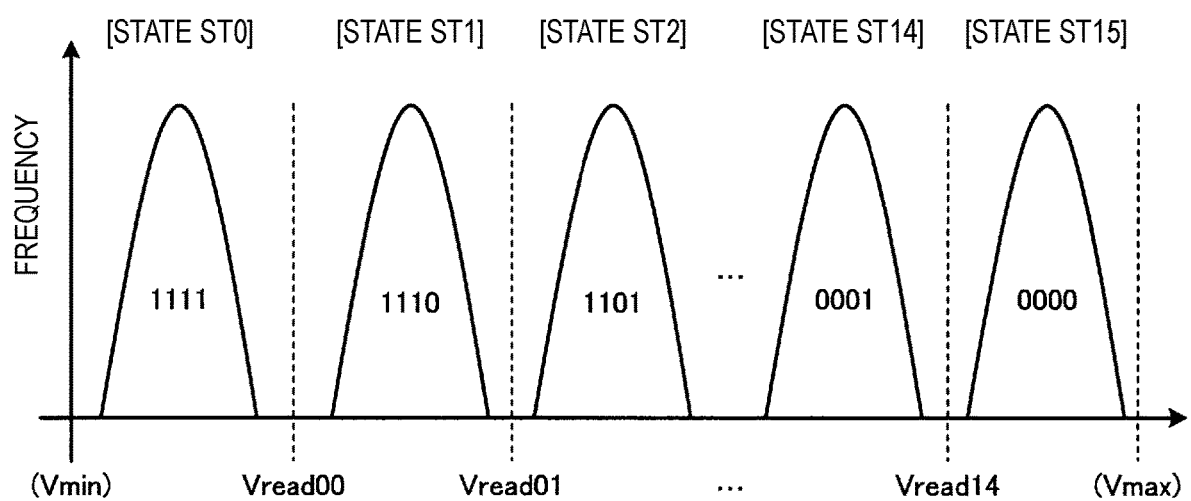
FIG. 4 is a diagram illustrating an example of a configuration of a threshold voltage of a QLC type memory cells.

FIG. 4 is a diagram illustrating an example of the configuration of a threshold voltage for a QLC type memory cell MC.

In FIG. 4, the vertical axis represents the (detection) frequency of the threshold voltage of a memory cell, and the horizontal axis represents a threshold voltage.

The range in which the threshold voltage is controlled (the range of Vmin to Vmax in FIG. 4) is divided into 16 states (small regions) ST0 to ST15. The states ST0 to ST15 are associated with different 4-bit values.

Specifically, in the example of FIG. 4, the 16 small regions ST0 to ST15 correspond to 4-bit values (data) of "1111", "1110", "1101", "1100", "1011", "1010" "1001", "1000", "0111", "0110", "0101", "0100", "0011", "0010", "0001" and "0000" from the low voltage side. That is, the 4-bit values are respectively associated with the states in the descending order from the lower voltage side. In FIG. 4, "1100" to "0010" are omitted.

In the program operation, the threshold voltage of a memory cell MC to be programmed is controlled so as to belong to a state corresponding to data to be programmed among the 16 states ST0 to ST15 corresponding to identification threshold voltages Vread00 to Vread15. As a result, in a page or block after the programming, the frequency of the threshold voltage of the plurality of memory cells MC (the frequency of appearance of the memory cell with respect to the threshold voltage) is formed with 16 mountain-shaped distributions illustrated in FIG. 4.

A correspondence between the state and the data is not limited to the example illustrated in FIG. 4.

Further, in FIG. 4, for example, when an identification threshold voltage Vread00 is set to 0V, the range in which the threshold voltage is controlled (the range of Vmin to Vmax) is set from a negative region to a positive region. The setting of the range in which the threshold voltage is controlled is not limited thereto. For example, the range in which the threshold voltage is controlled may be set only in the positive region.

Next, an example of the circuit configuration of a sense amplifier circuit according to the first embodiment will be described in detail.

Figure 5:
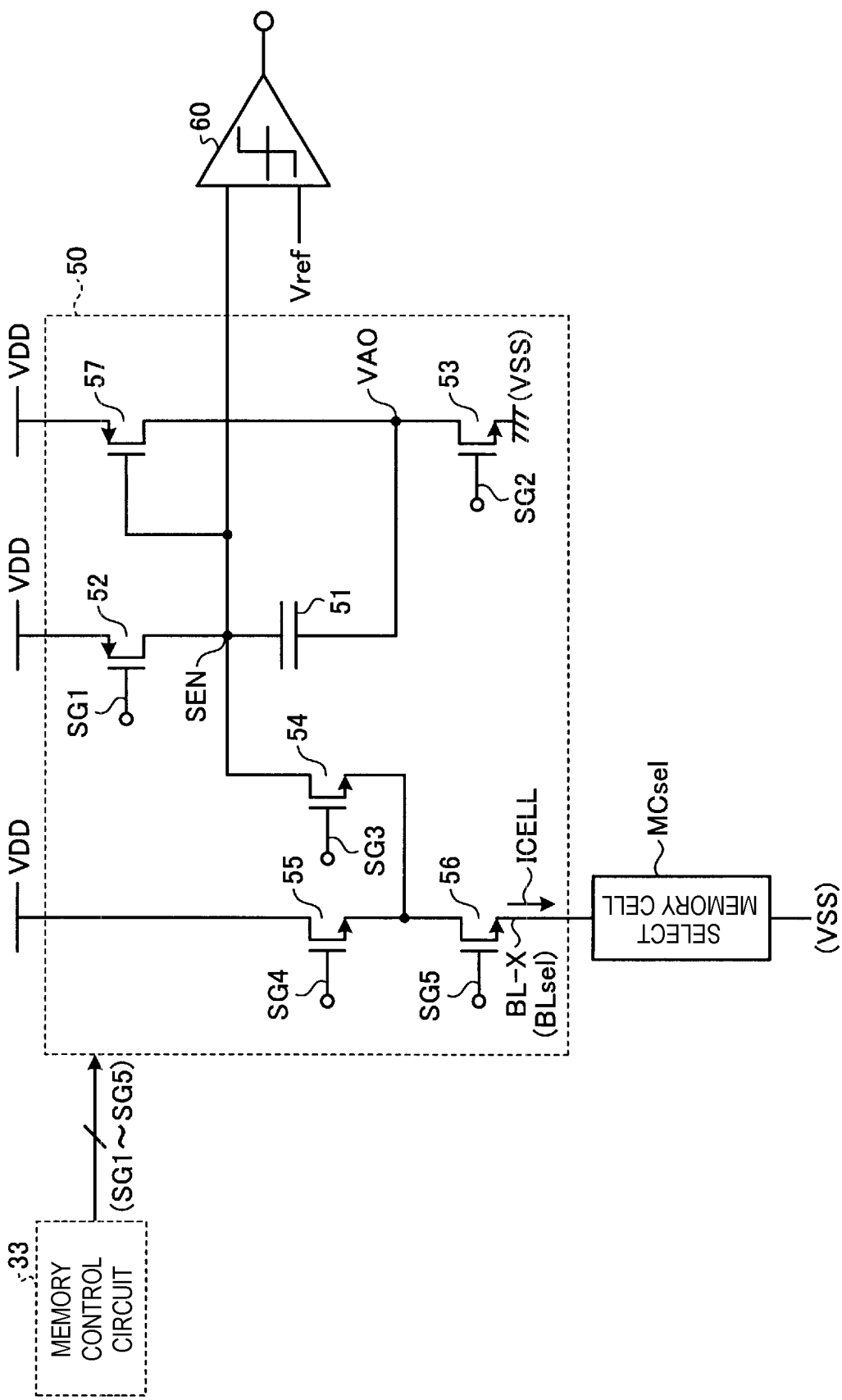
FIG. 5 is an explanatory diagram of an example of a circuit configuration of a sense amplifier circuit according to the first embodiment.

FIG. 5 is an explanatory diagram of an example of the circuit configuration of a sense amplifier circuit 50 according to the first embodiment.

The sense amplifier circuit 50 includes an integrating capacitor 51 as an example of a first capacitance element, a first charging transistor 52, a second charging transistor 53, a discharging transistor 54, a power supply transistor 55, a select transistor 56 and an amplifier transistor 57. The integrating capacitor 51 stores charges corresponding to the amount of current flowing through a cell. The first charging transistor 52 has a drain terminal connected to the first terminal of the integrating capacitor 51 and a source terminal connected to the power supply VDD of a voltage VDD, and functions as a charging switch for charging the integrating capacitor 51 with charges. The second charging transistor 53 has a drain terminal connected to the second terminal of the integrating capacitor 51 and a source terminal connected to the ground VSS, and functions as a charging switch for charging the integrating capacitor 51 with charges. The discharging transistor 54 has a source terminal connected to the drain terminal of the select transistor 56 and a drain terminal connected to the first terminal of the integrating capacitor 51, and functions as a discharging transistor for extracting charges from the integrating capacitor 51. The power supply transistor 55 has a drain terminal connected to the power supply VDD and a source terminal connected to the drain terminal of the select transistor 56, and allows a current from the select transistor 56 to flow to the power supply when the discharging transistor is turned off. The select transistor 56 has a drain terminal connected to the source terminal of the power supply transistor 55 and the source terminal of the discharging transistor 54, and a source terminal connected to a select bit line BLsel connected to a select memory cell MCsel and applies a read voltage to the select bit line BLsel. The amplifier transistor 57 functions as a discrete time amplifier having a gate terminal connected to the first terminal of the integrating capacitor 51, a drain terminal connected to the second terminal of the integrating capacitor 51, and a source terminal connected to the power supply VDD.

In the above configuration, a sense node SEN corresponding to the first terminal of the integrating capacitor 51 is connected to the input terminal of a comparator 60. A memory control circuit 33 controls a signal applied to each gate of the plurality of transistors in the sense amplifier circuit 50.

Here, prior to description of the embodiment, a configuration example and an operation example of a comparative example will be described.

Figure 6:
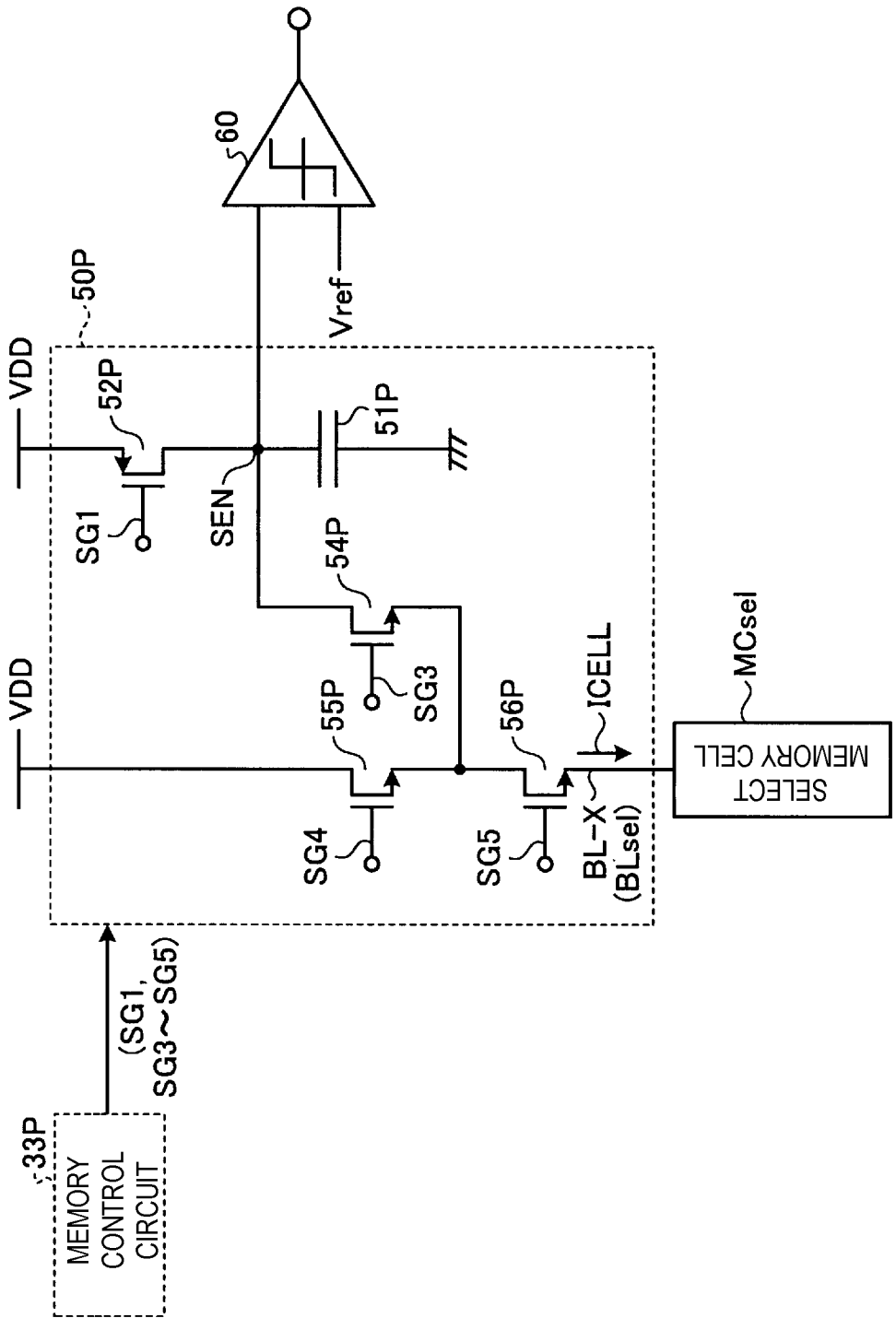
FIG. 6 is an explanatory diagram of an example of a circuit configuration of a sense amplifier circuit according to a comparative example.

FIG. 6 is an explanatory diagram of a circuit configuration example of a sense amplifier circuit 50P of a comparative example.

In FIG. 6, the same parts as those in FIG. 5 are denoted by the same reference numerals, and an explanation thereof is simplified or omitted.

Figure 7:
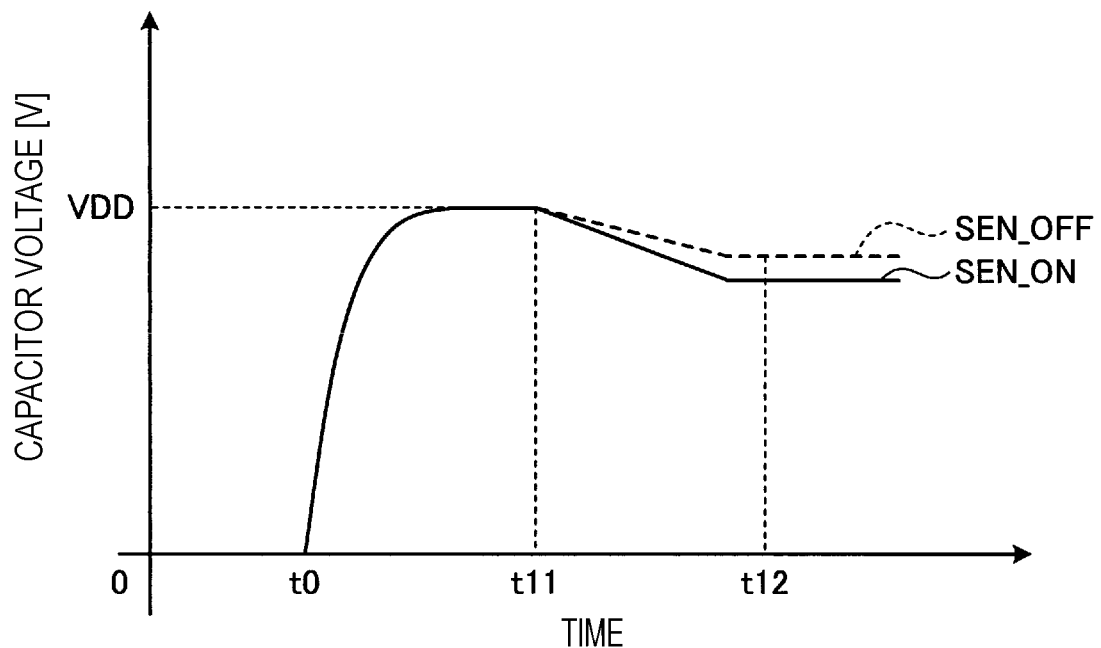
FIG. 7 is an operation explanatory diagram of the sense amplifier circuit according to the comparative example.

FIG. 7 is an operation explanatory diagram of the sense amplifier circuit 50P of the comparative example.

As illustrated in FIG. 6, the sense amplifier circuit 50P of the comparative example includes an integrating capacitor 51P, a charging transistor 52P, a discharging transistor 54P, a power supply transistor 55P and a select transistor 56P.

In the above configuration, the operations of the integrating capacitor 51P, the charging transistor 52P, the discharging transistor 54P, the power supply transistor 55P and the select transistor 56P are the same as the operations of the integrating capacitor 51, the first charging transistor 52, the discharging transistor 54, the power supply transistor 55 and the select transistor 56 in the first embodiment.

That is, the sense amplifier circuit 50P of the comparative example is different from the sense amplifier circuit 50 of the first embodiment in that the former does not include the second charging transistor 53 and the amplifier transistor 57 and the second terminal of the integrating capacitor 51P is connected to the ground potential. The node SEN is connected to the input terminal of the comparator 60. The memory control circuit 33P controls a signal applied to each gate of a plurality of transistors in the sense amplifier circuit 50P.

In the initial state, it is assumed that the integrating capacitor 51P is in a non-storage state and the charging transistor 52P, the discharging transistor 54P, the power supply transistor 55P and the select transistor 56P are all in an off state (open state).

First, the memory control circuit 33P puts the power supply transistor 55P in an on state (closed state) by a signal SG4="H" (logic high) and puts the gate terminal of the select transistor 56P connected to the select bit line BLsel connected to the select memory cell MCsel to be read in an on state (closed state) by a signal SG5 whose voltage is a predetermined bit line application voltage (e.g., 0.7V)+a threshold voltage Vth.

As a result, the voltage of the select bit line BLsel becomes the bit line application voltage (0.7V in the above example) when the bit line BL is read.

Then, the memory control circuit 33P applies the threshold voltage to a select word line WSEL (not illustrated) corresponding to the select memory cell MCsel.

First, the memory control circuit 33P puts the charging transistor 52P in an on state (closed state) by a signal SG1="L". As indicated in a period from time t0 to time t11 in FIG. 7, the integrating capacitor 51P is applied with the voltage of the power supply VDD, and the integrating capacitor 51P is charged up to the voltage of the power supply VDD.

Then, at time t11, the memory control circuit 33P puts the charging transistor 52P in an off state (opened state) by the signal SG1="H" in response to the elapse of time during which the integrating capacitor 51P is reliably charged up to the voltage of the power supply VDD.

Subsequently, at time t11, the memory control circuit 33P puts the discharging transistor 54P in an on state by a signal SG3="H". Then, the charges stored in the integrating capacitor 51P may flow, as a current ICELL, into the select memory cell MCsel via the discharging transistor 54P and the select transistor 56P.

In this case, the circuit has a configuration of only a passive element that integrates the current ICELL with the capacitance of the integrating capacitor 51P. For this reason, the voltage characteristic of the integrating capacitor 51P on the node SEN side after a certain time from the start of discharging becomes substantially linear, but the gain thereof is small.

That is, as illustrated in FIG. 7, at a determination timing of the comparator 60 at time t12, a difference between a voltage when the select memory cell MCsel to be read is in an on state (indicated by a solid line SEN_ON) and a voltage when the select memory cell MCsel to be read (indicated by a broken line SEN_OFF) is in an off state is small. That is, the voltage margin at the sense node SEN may not be made large and is susceptible to the operation variation of the comparator 60.

Therefore, in order to make it less susceptible to the operation variation of the comparator 60, the first embodiment employs a configuration in which an effective gain at the node SEN may be made substantially large, as will be described in detail below.

Next, the operation of the sense amplifier circuit 50 of the first embodiment will be described with reference to FIGS. 5, 8 and 9.

Figure 8:
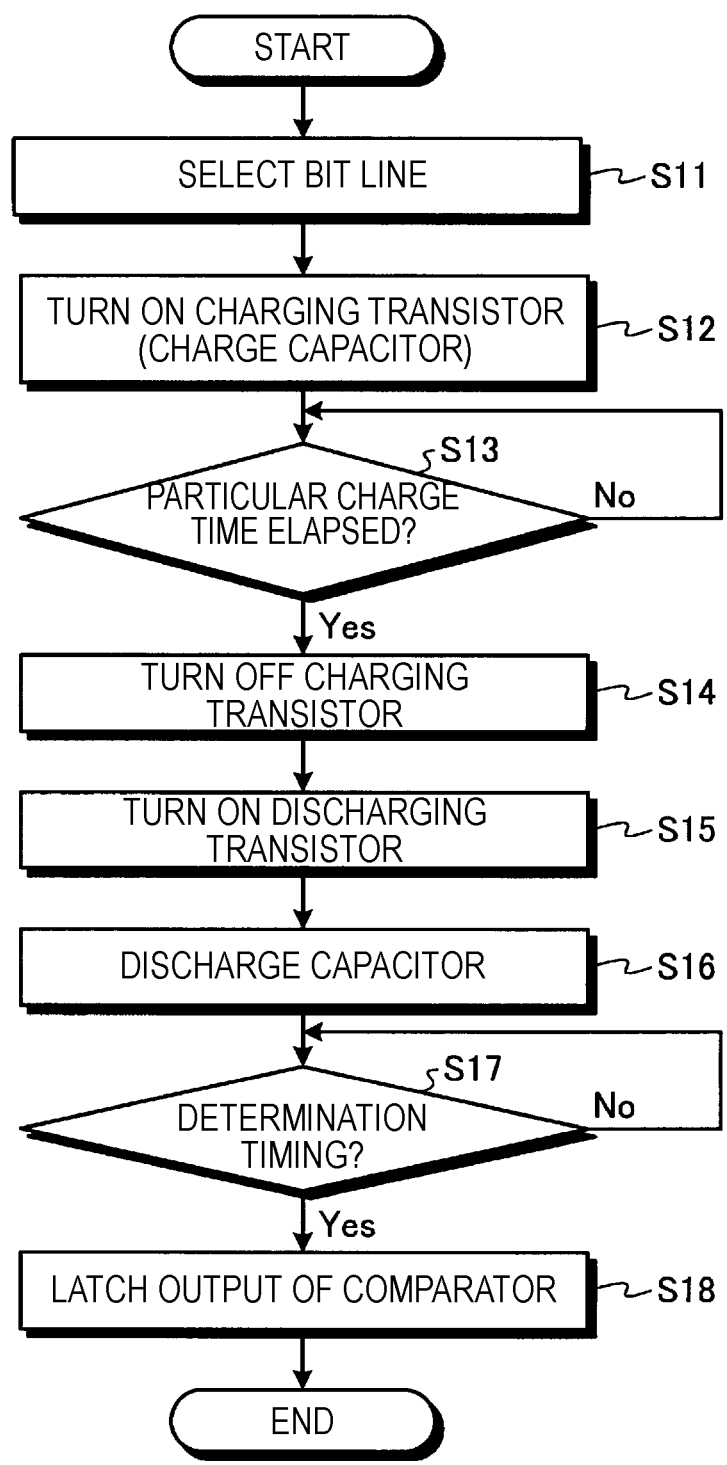
FIG. 8 is an operation flow chart of a sense amplifier circuit according to the first embodiment.

FIG. 8 is a flow chart of the operation of the sense amplifier circuit 50 of the first embodiment. FIG. 9 is an operation explanatory diagram of the sense amplifier circuit of the first embodiment.

In the initial state, it is assumed that the integrating capacitor 51 is in a non-storage state and the first charging transistor 52, the second charging transistor 53, the discharging transistor 54, the power supply transistor 55 and the select transistor 56 are all in an off state (opened state).

First, the memory control circuit 33 puts the power supply transistor 55 connected to the select bit line BLsel to which the select memory cell MCsel to be read is connected in an on state (closed state) by the signal SG4=H, and puts the gate terminal of the select transistor 56 in an on state (closed state) by the signal SG5 whose voltage is a predetermined bit line application voltage (e.g., 0.7V)+a threshold voltage Vth, thereby entering a bit line select state (S11).

As a result, the voltage of the select bit line BLsel becomes the bit line application voltage (0.7V in the above example) when the bit line BL is read.

Then, the memory control circuit 33 applies the threshold voltage to a select word line WSEL (not illustrated) corresponding to the select memory cell MCsel.

More specifically, for example, when the select memory cell MCsel is of a QLC type, the threshold voltage applied to the select word line WSEL becomes one of 15 read threshold voltages Vread00 to Vread14 as illustrated in FIG. 4.

Next, the memory control circuit 33 puts the first charging transistor 52 and the second charging transistor 53 in an on state (closed state) by the signal SG1="L" (logic low) and the signal SG2 (=/SG1)="H" (S12).

As a result, the sense node SEN is connected to the power supply VDD via the first charging transistor 52, and a node VAO is connected to the ground via the second charging transistor 53.

Subsequently, the memory control circuit 33 determines whether a particular charge time has elapsed (S13).

When it is determined in S13 that the particular charge time has not yet elapsed ("No" in S13), the integrating capacitor 51 is charged. That is, as indicated in a period from time t0 to time t1 in FIG. 9, the voltage VDD of the power supply VDD is applied to the integrating capacitor 51 and the integrating capacitor 51 is charged up to the voltage VDD of the power supply VDD.

When it is determined in S13 that the particular charge time has elapsed ("Yes" in S13), the first charging transistor 52 and the second charging transistor 53 are put in an off state (opened state) by the signal SG1="H" and the signal SG2 (=/SG1)="L" (S14).

Figure 9:
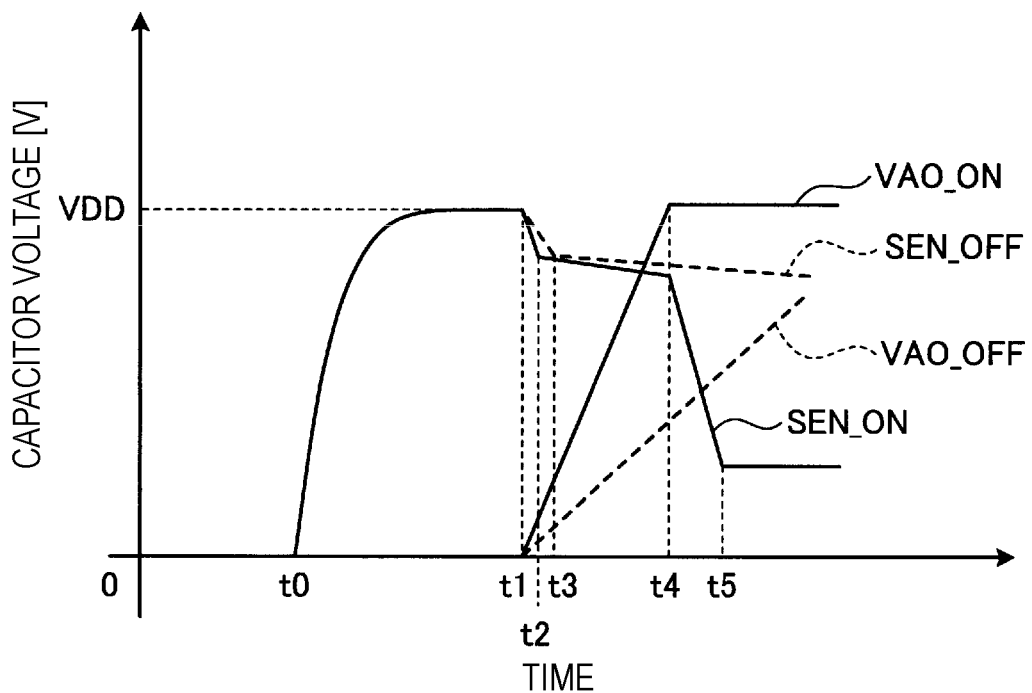
FIG. 9 is an operation explanatory diagram of a sense amplifier circuit according to the first embodiment.

More specifically, in the example of FIG. 9, at time t1, the memory control circuit 33 puts the first charging transistor 52 and the second charging transistor 53 in an off state (opened state).

Subsequently, the memory control circuit 33 puts the discharging transistor 54 in an on state by the signal SG3="H" (S15). At this time, the amplifier transistor 57 is not operating in the initial state because the storage voltage of the integrating capacitor 51 (the voltage of the power supply VDD in the initial state) is applied to the gate terminal of the amplifier transistor 57. However, as the charges stored in the integrating capacitor 51 flow into the select memory cell MCsel via the discharging transistor 54 and the select transistor 56 and are discharged (S16), the amplifier transistor 57 starts to operate as a discrete time amplifier.

As a result, the amplifier transistor 57 operates in an active region in proportion to the storage voltage of the integrating capacitor 51 and the voltage of the node VAO gradually increases so as to approach the voltage of the power supply VDD.

Meanwhile, the integrating capacitor 51 functions as a feedback capacitor for the amplifier transistor 57 functioning as the discrete time amplifier.

Therefore, assuming that the voltage amplification factor of the amplifier transistor 57 is A, when viewed from the input side of the amplifier transistor 57 as the discrete time amplifier, the apparent capacitance of the integrating capacitor 51 is (1+A) times the original capacitance of the integrating capacitor 51 due to a miller effect.

At this time, when a threshold voltage Vthmcx programmed in the select memory cell MCsel is lower than an identification threshold voltage VreadXX set in the word line WL corresponding to the select memory cell MCsel (VreadXX>Vthmcx), the select memory cell MCsel is put in an on state (on-cell). When the threshold voltage Vthmcx programmed in the select memory cell MCsel is higher than the identification threshold voltage VreadXX set in the word line WL (VreadXX<Vthmcx), the select memory cell MCsel is put in an off state (off-cell).

Therefore, the magnitude of the current ICELL that flows from the integrating capacitor 51 to the select memory cell MCsel via the discharging transistor 54 and the select transistor 56 differs significantly by the identification threshold voltage VreadXX set in the word line WL depending on whether the select memory cell MCsel is in an on state. In addition, the magnitude of the current ICELL flowing through the select memory cell MCsel differs depending on whether the threshold voltage Vthmcx programmed in the select memory cell MCsel is on the higher or lower voltage side in the threshold distribution.

That is, in this embodiment, when the threshold voltage Vthmcx programmed in the select memory cell MCsel is lower than the voltage Vwlsel of the select word line WLsel (Vthmcx<Vwlsel), the select memory cell MCsel is put in an on state (on-cell) and the current ICELL increases. When the threshold voltage Vthmcx programmed in the select memory cell MCsel is higher than the voltage Vwlsel of the word line WL (Vthmcx>Vwlsel), the select memory cell MCsel is put in an off state (off-cell) and the current ICELL decreases. Even when the select memory cell MCsel is in the on state (on-cell), the current ICELL decreases as the threshold voltage Vthmcx increases.

Next, the respective operations when the threshold voltage programmed in the select memory cell MCsel is higher and lower than the identification threshold voltage VreadXX set in the select word line WLsel will be described.

[1.1] Case where the threshold voltage Vthmcx of the select memory cell MCsel program is lower than the identification threshold voltage VreadXX set in the select word line WLsel (Vthmcx<VreadXX) (case where the select memory cell MCsel is an on-cell)

First, descriptions will be made on a case where the threshold voltage programmed in the select memory cell MCsel is lower than the identification threshold voltage VreadXX set in the word line WL.

When the threshold voltage programmed in the select memory cell MCsel is lower than the identification threshold voltage VreadXX set in the word line WL and the select memory cell MCsel is put in an on state to increase the current ICELL, a current flows from the integrating capacitor 51 toward the select memory cell MCsel, the voltage of the integrating capacitor 51 gradually decreases, and the source-drain current of the amplifier transistor 57 gradually increases.

Accordingly, as indicated by a solid line SEN_ON in FIG. 9, the voltage of the sense node SEN, that is, the gate voltage of the amplifier transistor 57, gradually decreases from time t1, and the source-drain current of the amplifier transistor 57 gradually increases. As indicated by a solid line VAO_ON in FIG. 9, the voltage of the node VAO gradually increases. For this reason, since both ends of the integrating capacitor 51 operate in reverse phase, the integrating capacitor 51 acts like a large capacitor particularly from the node SEN side due to the influence of the miller effect.

At time t4, when the voltage of the node VAO becomes substantially equal to the voltage of the power supply VDD, a current between the source and drain of the amplifier transistor 57 does not flow and the amplification operation of the amplifier transistor 57 is stopped.

As a result, since the miller effect does not work, the capacitance of the integrating capacitor 51 becomes the original capacitance, but the amount of current flowing from the integrating capacitor 51 to the select memory cell MCsel via the discharging transistor 54 does not change. Therefore, the voltage of the sense node SEN after time t4 rapidly decreases.

Thereafter, at time t5, the voltage of the integrating capacitor 51 becomes substantially constant.

Therefore, during a period from time t4 to time t5, the voltage of the input terminal of the comparator 60 also changes sharply.

That is, as illustrated in FIG. 8, the memory control circuit 33 determines whether a predetermined determination timing has been reached (S17).

When it is determined that the predetermined determination timing has not been reached ("No" in S17), the memory control circuit 33 enters a standby state. When it is determined that the predetermined determination timing has been reached ("Yes" in S17), the output of the comparator 60 is latched in the data register 36 (S18) and the process is ended.

[1.2] Case where the threshold voltage Vthmcx programmed in the select memory cell MCsel is higher than the identification threshold voltage VreadXX set in the select word line WLsel (Vthmcx>VreadXX: case where the select memory cell MCsel is an off-cell)

Next, descriptions will be made on a case where the threshold voltage programmed in the select memory cell MCsel is higher than the identification threshold voltage VreadXX set in the word line WL.

At time t3, after the voltage of the sense node SEN drops to about the threshold voltage of the amplifier transistor 57, even when the threshold voltage programmed in the select memory cell MCsel is higher than the identification threshold voltage VreadXX set in the word line WL and the select memory cell MCsel goes to an off state to decrease the current ICELL, a current flows from the integrating capacitor 51 toward the select memory cell MCsel, the voltage of the integrating capacitor 51 gradually decreases, and the source-drain current of the amplifier transistor 57 gradually increases.

However, the current flowing through a select memory cell MCsel that is an off-cell is smaller than the current of a select memory cell MCsel that is an on-cell.

Accordingly, as indicated by a broken line SEN_OFF in FIG. 9, the drop of the voltage of the sense node SEN, that is, the gate voltage of the amplifier transistor 57, from time t1 is slower than the case where the threshold voltage programmed in the select memory cell MCsel is lower than the identification threshold voltage VreadXX set in the word line WL, the source-drain current of the amplifier transistor 57 increases slowly, and the voltage of the node VAO increases slowly.

However, since the voltage drop of the sense node SEN when the select memory cell MCsel is an off-cell is slow, the voltage of the node VAO when the select memory cell MCsel is an off-cell does not become substantially equal to the voltage VDD of the power supply VDD in a predetermined determination period (after time t5). Therefore, during the predetermined determination period, the amplification operation of the amplifier transistor 57 is continued.

As a result, the miller effect continues to work, and the apparent capacitance of the integrating capacitor 51 during the determination period remains larger than the actual capacitance thereof.

Therefore, the voltage at the input terminal of the comparator 60 does not become lower than the reference voltage Vref of the comparator 60 during the determination period.

That is, in a predetermined determination period (preferably, a predetermined period after time t5), even when there is an influence of operation variation of the comparator 60 which is provided corresponding to each bit line BL, since a change in voltage of the node SEN corresponding to the current ICELL is steep, it is possible to determine the threshold voltage programmed in the select memory cell MCsel and further, the state of the select memory cell MCsel.

As described above, according to the first embodiment, it is possible to effectively significantly increase the gain of the sense amplifier circuit. In addition, as illustrated in FIG. 9, it is possible to provide a large (voltage) margin between the solid line SEN_ON that is the voltage of the sense node SEN detected when the select memory cell MCsel is in an on state (on-cell) and the broken line SEN_OFF that is the voltage of the sense node SEN detected when the select memory cell MCsel is in an off state (off-cell). Further, even when there is an influence of operation variations of a large number of comparators 60 provided for respective sense amplifier circuits, it is possible to perform reliable determination for the comparators 60.

[2] Second Embodiment

Next, a second embodiment will be described.

Figure 10:
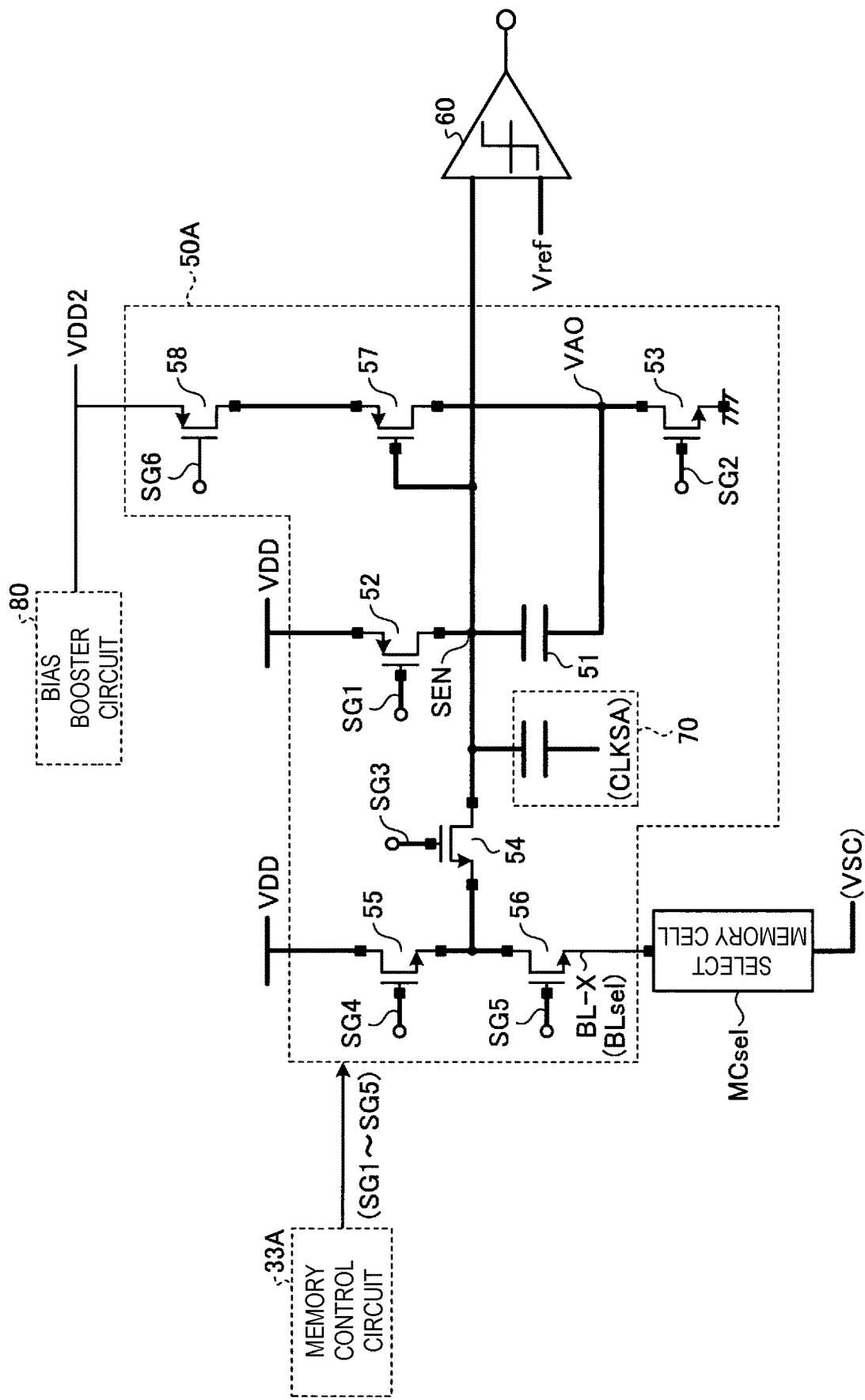
FIG. 10 is an explanatory diagram of an example of a circuit configuration of a sense amplifier circuit according to a second embodiment.

FIG. 10 is an explanatory diagram of an example of the circuit configuration of a sense amplifier circuit 50A according to a second embodiment.

In FIG. 10, the same parts as those in FIG. 5 are denoted by the same reference numerals, and an explanation thereof is simplified or omitted.

In the second embodiment, in order to meet a demand for expanding a voltage range of a memory cell, the potential VSC of a source line of a memory cell MC is set to be higher than the potential of the low potential side power supply VSS of the first embodiment. When such a configuration is adopted, it becomes difficult for a current to flow from the sense node SEN to the select memory cell MCsel. For this reason, in the second embodiment, a clock voltage circuit 70 and a bias booster circuit 80 are provided in order to increase the potential of the sense node SEN and the potential of the node VAO. The clock voltage circuit 70 includes a capacitor that is charged by a clock signal CLKSA having the amplitude of a voltage VDD. The bias booster circuit 80 generates a voltage VDD2 that is about twice the voltage VDD.

Similarly to the first embodiment, the sense amplifier circuit 50A of the second embodiment includes the integrating capacitor 51, the first charging transistor 52, the second charging transistor 53, the discharging transistor 54, the power supply transistor 55, the select transistor 56 and the amplifier transistor 57. However, unlike the first embodiment, the sense amplifier circuit 50A of the second embodiment further includes a switch transistor 58.

Here, the switch transistor 58 controls the supply of a voltage VDD2 supplied from the bias booster circuit 80 by a signal SG6.

Even in the second embodiment, the sense node SEN corresponding to one terminal of the integrating capacitor 51 is connected to the input terminal of the comparator 60 at the next stage.

Next, the operation of the sense amplifier circuit of the second embodiment will be described with reference to FIGS. 10 and 11.

FIG. 11 is an explanatory diagram of the operation of the sense amplifier circuit of the second embodiment.

In the initial state, it is assumed that the integrating capacitor 51 is in a storage state of the voltage VDD of the power supply VDD, the first charging transistor 52 and the second charging transistor 53 are in an on state (closed state), and the discharging transistor 54, the power supply transistor 55, the select transistor 56 and the switch transistor 58 are all in an off state (opened state).

As illustrated in part (A) of FIG. 11, first, at time t0, a memory control circuit 33A puts the first charging transistor 52 in an off state (opened state) by the signal SG1="H" and completes the charging of the integrating capacitor 51. Then, the clock voltage circuit 70 starts boosting the voltage of the sense node SEN by changing the voltage CLKSA from the voltage VSS to the voltage VDD under control of the memory control circuit 33A.

As a result, the voltage CLKSA of the clock voltage circuit 70 is superimposed on the voltage of the integrating capacitor 51, and the voltage of the sense node SEN becomes about twice the voltage of the power supply VDD as indicated in a period from time t0 to time t1 in FIG. 11.

Further, the memory control circuit 33A puts the switch transistor 58 in an on state (closed state) by the signal SG6="L" and applies the voltage VDD2 (=about VDD×2) from the bias booster circuit 80 to the source terminal of the amplifier transistor 57.

Then, at time t1, the memory control circuit 33A determines whether a predetermined charge time during which the voltage of the sense node SEN is approximately twice the voltage of the power supply VDD has elapsed.

When it is determined that the predetermined charge time has not yet elapsed, the memory control circuit 33A enters the standby state. When it is determined that the predetermined charge time has elapsed, the memory control circuit 33A puts the second charging transistor 53 in an off state (opened state) by the signal SG2="L".

Subsequently, the memory control circuit 33A puts the discharging transistor 54 in an on state by the signal SG3="H". At this time, since the storage voltage of the integrating capacitor 51 (the voltage of the power supply voltage VDD×2 in the initial state) is applied to the gate terminal of the amplifier transistor 57, the amplifier transistor 57 is not operating in the initial state. However, since the charges stored in the integrating capacitor 51 flow into the select memory cell MCsel via the discharging transistor 54 and the select transistor 56, the amplifier transistor 57 starts to operate as a discrete time amplifier.

As a result, the amplifier transistor 57 operates in an active region in proportion to the voltage of the integrating capacitor 51, the voltage of the node VAO gradually increases so as to approach the voltage of the power supply VDD2, and the integrating capacitor 51 functions as a feedback capacitor for the amplifier transistor 57 functioning as the discrete time amplifier.

Therefore, assuming that the voltage amplification factor of the amplifier transistor 57 is A, when viewed from the input side of the amplifier transistor 57 as the discrete time amplifier, the apparent capacitance of the integrating capacitor 51 is (1+A) times the original capacitance of the integrating capacitor 51 due to a miller effect.

At this time, when a threshold voltage Vthmcx programmed in the select memory cell MCsel is lower than an identification threshold voltage VreadXX (corresponding to one of the identification threshold voltages Vread00 to Vread14 in FIG. 4) set in the word line WL corresponding to the select memory cell MCsel (VreadXX>Vthmcx), the select memory cell MCsel is put in an on state (on-cell). When the threshold voltage Vthmcx programmed in the select memory cell MCsel is higher than the identification threshold voltage VreadXX set in the word line WL (VreadXX<Vthmcx), the select memory cell MCsel is put in an off state (off-cell).

Therefore, the magnitude of the current ICELL that flows from the integrating capacitor 51 to the select memory cell MCsel via the discharging transistor 54 and the select transistor 56 differs significantly by the identification threshold voltage VreadXX set in the word line WL depending on whether the select memory cell MCsel is in an on state. In addition, the magnitude of the current ICELL flowing through the select memory cell MCsel differs depending on whether the threshold voltage Vthmcx programmed in the select memory cell MCsel is on the higher or lower voltage side in the threshold distribution.

That is, even in this embodiment, when the threshold voltage Vthmcx programmed in the select memory cell MCsel is lower than the voltage Vwlsel of the select word line WLsel (Vthmcx<Vwlsel), the select memory cell MCsel is put in an on state (on-cell) and the current ICELL increases. When the threshold voltage Vthmcx programmed in the select memory cell MCsel is higher than the voltage Vwlsel of the word line WL (Vthmcx>Vwlsel), the select memory cell MCsel is put in an off state (off-cell) and the current ICELL decreases. Even when the select memory cell MCsel is in the on state (on-cell), the current ICELL decreases as the threshold voltage Vthmcx increases.

[2.1] Case where the threshold voltage Vthmcx programmed in the select memory cell MCsel program is lower than the identification threshold voltage VreadXX set in the select word line WLsel (Vthmcx<VreadXX)

First, descriptions will be made on a case where the threshold voltage Vthmcx programmed in the select memory cell MCsel is lower than the identification threshold voltage VreadXX set in the word line WL (Vthmcx<VreadXX).

When the threshold voltage programmed in the select memory cell MCsel is lower than the identification threshold voltage VreadXX set in the word line WL and the select memory cell MCsel is put in an on state to increase the current ICELL, a current flows from the integrating capacitor 51 toward the select memory cell MCsel, the voltage of the integrating capacitor 51 gradually decreases, and the source-drain current of the amplifier transistor 57 gradually increases.

Accordingly, as indicated by a solid line SEN_ON in part (A) of FIG. 11, the voltage of the sense node SEN, that is, the gate voltage of the amplifier transistor 57, gradually decreases from time t1, and the source-drain current of the amplifier transistor 57 gradually increases. As indicated by a solid line VAO_ON in part (A) of FIG. 11, the voltage of the node VAO gradually increases. For this reason, since both ends of the integrating capacitor 51 operate in reverse phase, the integrating capacitor 51 acts like a large capacitor particularly from the node SEN side due to the influence of the miller effect. At time t4, when the voltage of the node VAO becomes substantially equal to the voltage of the power supply VDD2, the amplification operation of the amplifier transistor 57 is stopped.

As a result, since the miller effect does not work, the capacitance of the integrating capacitor 51 becomes the original capacitance, but the amount of current flowing from the integrating capacitor 51 to the select memory cell MCsel via the discharging transistor 54 does not change. Therefore, the voltage of the sense node SEN after time t4 rapidly decreases.

Thereafter, at time t5, the voltage of the integrating capacitor 51 becomes substantially constant. Thereafter, at time t6, the memory control circuit 33A turns off the switch transistor 58 by setting the SG6 to "H" (corresponding to the voltage VDD2). Time t6 may be any time after time t5.

Therefore, during a period from time t4 to time t5, the voltage of the input terminal of the comparator 60 also changes sharply.

Therefore, the memory control circuit 33A determines whether a predetermined determination timing (for example, time t6) has been reached. When it is determined that the predetermined determination timing has not been reached, the memory control circuit 33A enters a standby state. When it is determined that the predetermined determination timing has been reached, the clock voltage circuit 70 changes the voltage CLKSA from the voltage VDD to the voltage VSS under control of the memory control circuit 33A, so that the output of the comparator 60 is latched in the data register 36 after the voltage of the sense node SEN is stepped down. Then, the process is ended.

[2.2] Case where the threshold voltage Vthmcx programmed in the select memory cell MCsel is higher than the identification threshold voltage VreadXX set in the word line WL (Vthmcx>VreadXX)

Next, descriptions will be made on a case where the threshold voltage programmed in the select memory cell MCsel is higher than the identification threshold voltage VreadXX set in the word line WL.

As illustrated in part (B) of FIG. 11, at time t3 (>time t2), after the voltage of the sense node SEN drops to about the threshold voltage of the amplifier transistor 57+the power supply voltage VDD, even when the threshold voltage programmed in the select memory cell MCsel is higher than the identification threshold voltage VreadXX set in the word line WL and the select memory cell MCsel goes to an off state to decrease the current ICELL, a current flows from the integrating capacitor 51 toward the select memory cell MCsel, the voltage of the integrating capacitor 51 gradually decreases, and the source-drain current of the amplifier transistor 57 gradually increases.

However, the current flowing through a select memory cell MCsel that is an off-cell is smaller than the current of a select memory cell MCsel that is an on-cell.

Accordingly, as indicated by a solid line SEN_OFF in part (B) of FIG. 11, the drop of the voltage of the sense node SEN, that is, the gate voltage of the amplifier transistor 57, from time t1 is slower than the case where the threshold voltage programmed in the select memory cell MCsel is lower than the identification threshold voltage VreadXX set in the word line WL, the source-drain current of the amplifier transistor 57 increases slowly, and the voltage of the node VAO increases slowly. At this time, since both ends of the integrating capacitor 51 operate in reverse phase, the integrating capacitor 51 acts like a large capacitor particularly from the node SEN side due to the influence of the miller effect.

However, since the voltage drop of the sense node SEN is slow, the voltage of the node VAO does not become substantially equal to the voltage of the power supply VDD2 in a predetermined determination period (after time t5). Therefore, during the predetermined determination period, the amplification operation of the amplifier transistor 57 is continued.

As a result, the miller effect continues to work, and the apparent capacitance of the integrating capacitor 51 during the determination period remains larger than the actual capacitance thereof.

Therefore, the memory control circuit 33A determines whether a predetermined determination timing has been reached. When it is determined that the predetermined determination timing has not been reached, the memory control circuit 33A enters a standby state. When it is determined that the predetermined determination timing has been reached, the clock voltage circuit 70 changes the voltage CLKSA from the voltage VDD to the voltage VSS under control of the memory control circuit 33A, so that the output of the comparator 60 is latched in the data register 36 after the voltage of the sense node SEN is stepped down. Then, the process is ended. At this time, the voltage of the input terminal of the comparator 60 does not become smaller than the reference voltage Vref of the comparator 60.

As described above, according to the second embodiment, even when the potential VSC of the source line of the memory cell MC is higher than the potential of the low potential side power supply VSS of the first embodiment, it is possible to effectively significantly increase the gain of the sense amplifier circuit, thereby reducing the influence of operation variation of the comparator 60.

[3] Third Embodiment

Next, a third embodiment will be described.

Figure 12:
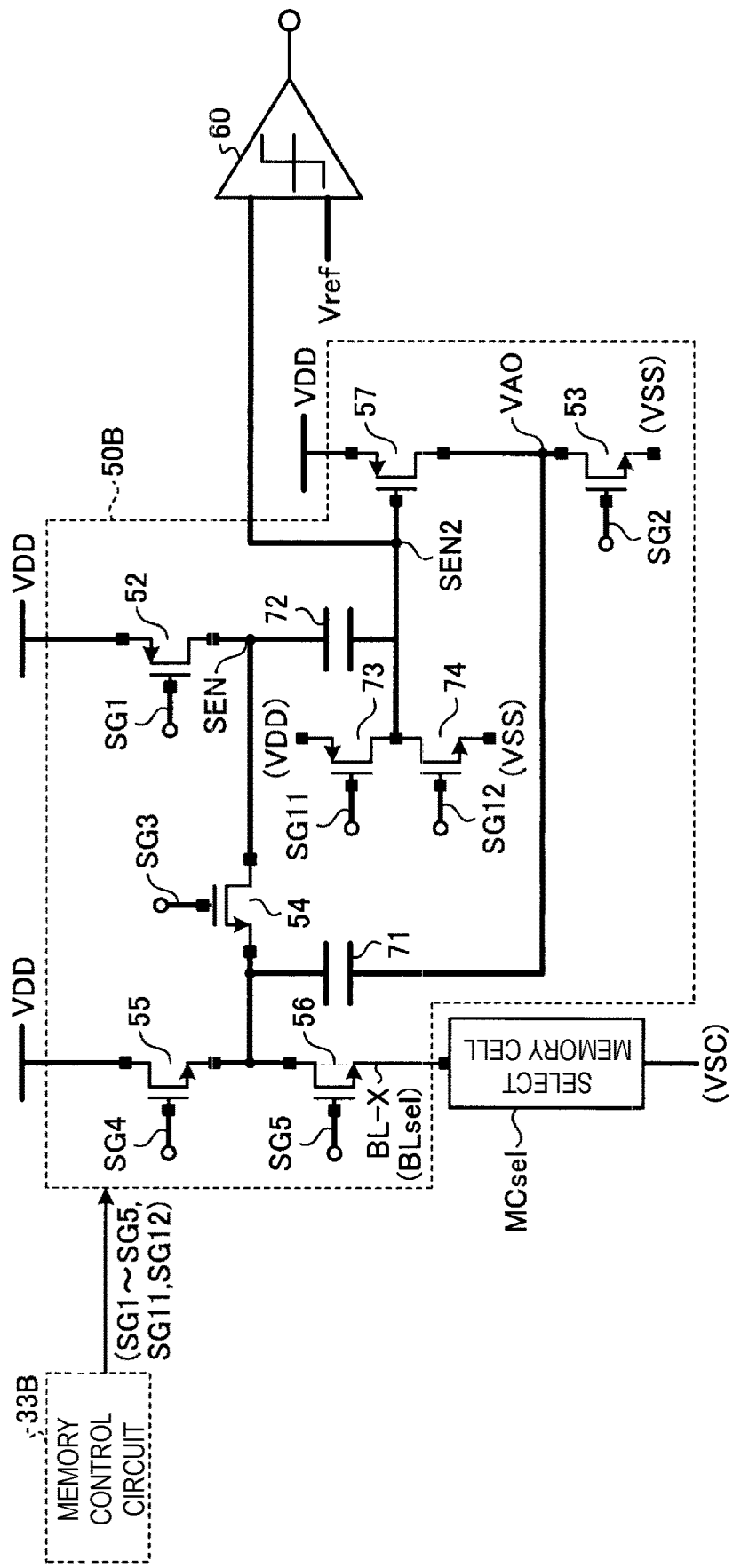
FIG. 12 is an explanatory diagram of an example of the circuit configuration of a sense amplifier circuit according to a third embodiment.

FIG. 12 is an explanatory diagram of an example of the circuit configuration of a sense amplifier circuit according to a third embodiment.

In FIG. 12, the same parts as those in FIG. 5 are denoted by the same reference numerals.

Similarly to the second embodiment, the third embodiment is an embodiment that meets the demand for further expanding the voltage range of the memory cell MC. A sense amplifier circuit 50B according to the third embodiment is different from that of the first embodiment in that the former includes an integrating capacitor 71 having one terminal connected to the connection point between the source terminal of the discharging transistor 54 and the drain terminal of the select transistor 56 and the other terminal connected to the drain terminal of the amplifier transistor 57, instead of the integrating capacitor 51, a voltage shift capacitor 72 having one terminal connected to the drain terminal of the discharging transistor 54 and the other terminal connected to the gate terminal of the amplifier transistor 57, and transistor 73 and 74 for switching the potential of a sense node SEN2 to the potential of the power supply VDD or the low potential side power supply VSS under control of a memory control circuit 33B.

Further, as in the first embodiment, the sense amplifier circuit 50B of the third embodiment includes a first charging transistor 52, a second charging transistor 53, a discharging transistor 54, a power supply transistor 55 and a select transistor 56.

In the third embodiment, the sense node SEN is not connected to the input terminal of the comparator 60. Instead, the gate terminal of the amplifier transistor 57 functions as the sense node SEN2 and is connected to the input terminal of the comparator 60 at the next stage.

Next, the operation of the sense amplifier circuit of the third embodiment will be described with reference to FIGS. 12 and 13.

FIG. 13 is an explanatory diagram of the operation of the sense amplifier circuit of the third embodiment.

In the initial state, it is assumed that the integrating capacitor 71 is in a non-storage state and the first charging transistor 52, the second charging transistor 53, the discharging transistor 54, the power supply transistor 55 and the select transistor 56 are all in an off state (opened state).

First, immediately before time t0, the memory control circuit 33B puts the first charging transistor 52 in an on state (closed state) by the signal SG1="L" and puts the transistor 74 in an on state (closed state) by the signal SG12="H". As a result, the voltage shift capacitor 72 is charged with the voltage VDD.

Then, at time t0, the chip control circuit changes the voltage of the sense node SEN2 from VSS to VDD by turning on the transistor 73 with the signal SG11="L" and turning off the transistor 74 with the signal SG12="L". At this time, by turning off the first charging transistor 52 with the SG1="H", the voltage shift capacitor 72 starts boosting the voltage of the sense node SEN in response to the change in voltage of the sense node SEN2.

As a result, the voltage of the sense node SEN becomes twice the voltage of the power supply VDD, as indicated in a period from time t0 to time t1 in FIG. 13.

Meanwhile, the voltage of the second sense node SEN2 becomes the voltage of the power supply VDD, as indicated in the period from time t0 to time t1 in FIG. 13.

Then, at time t1, the memory control circuit 33B determines whether a predetermined charge time during which the voltage of the sense node SEN is twice the voltage of the power supply VDD has elapsed. When it is determined that the predetermined charge time has not yet elapsed, the memory control circuit 33B enters a standby state. When it is determined that the predetermined charge time has elapsed, the second charging transistor is turned on with the signal SG2="H" and, after the VAO node is charged up to the voltage VSS, the second charging transistor is turned off with the signal SG2="L". Further, the transistor 73 is turned off with the signal SG11="H".

Subsequently, the memory control circuit 33B puts the discharging transistor 54 in an on state by the signal SG3. At this time, the storage voltage of the voltage shift capacitor 72 (the voltage of the power supply VDD in the initial state) is applied to the gate terminal of the amplifier transistor 57.

Meanwhile, the charges stored in the voltage shift capacitor 72 and the integrating capacitor 71 flow from the sense node SEN into the select memory cell MCsel via the discharging transistor 54 and the select transistor 56.

As a result, the voltage of the sense node SEN of the voltage shift capacitor 72 gradually decreases, the voltage of the sense node SEN2 gradually decreases due to the influence, and the amplifier transistor 57 starts operating as a discrete time amplifier.

As a result, the amplifier transistor 57 operates in an active region and the voltage of the node VAO gradually increases so as to approach the voltage of the power supply VDD.

Further, the integrating capacitor 71 functions as a feedback capacitor for the amplifier transistor 57 functioning as the discrete time amplifier.

Therefore, assuming that the voltage amplification factor of the amplifier transistor 57 is A, when viewed from the input side of the amplifier transistor 57 as the discrete time amplifier, the apparent capacitance of the integrating capacitor 71 is (1+A) times the original capacitance of the integrating capacitor 71 due to a miller effect.

At this time, when a threshold voltage Vthmcx programmed in the select memory cell MCsel is lower than an identification threshold voltage VreadXX (corresponding to one of the identification threshold voltages Vread00 to Vread14 in FIG. 4) set in the word line WL corresponding to the select memory cell MCsel at the corresponding point of time (VreadXX>Vthmcx), the select memory cell MCsel is put in an on state (on-cell). When the threshold voltage Vthmcx programmed in the select memory cell MCsel is higher than the identification threshold voltage VreadXX set in the word line WL (VreadXX<Vthmcx), the select memory cell MCsel is put in an off state (off-cell).

Therefore, when the threshold voltage programmed in the select memory cell MCsel is lower than the voltage of the select word line WLSEL, the select memory cell MCsel is put in an on state (on-cell) to increase the current ICELL. When the threshold voltage programmed in the select memory cell MCsel is higher than the voltage of the word-line WL, the select memory cell MCsel is put in an off state (off-cell) to decrease the current ICELL.

[3.1] Case where the threshold voltage Vthmcx programmed in the select memory cell MCsel is lower than the identification threshold voltage VreadXX set in the select word line WLSEL (Vthmcx<VreadXX)

First, descriptions will be made on a case where the threshold voltage Vthmcx programmed in the select memory cell MCsel is lower than the identification threshold voltage VreadXX set in the word line WL (Vthmcx<VreadXX).

When the threshold voltage programmed in the select memory cell MCsel is lower than the identification threshold voltage VreadXX set in the word line WL and the select memory cell MCsel is put in an on state to increase the current ICELL, a current flows from the integrating capacitor 71 and the voltage shift capacitor 72 toward the select memory cell MCsel. Following this, the voltage across the voltage shift capacitor 72 gradually decreases and the source-drain current of the amplifier transistor 57 gradually increases.

Accordingly, as indicated by a solid line SEN2 ON in part (A) of FIG. 13, the voltage of the sense node SEN2, that is, the gate voltage of the amplifier transistor 57, gradually decreases from time t1, the source-drain current of the amplifier transistor 57 gradually increases, and, as indicated by a solid line VAO_ON in part (A) of FIG. 13, the voltage of the node VAO gradually increases. At this time, since both ends of the integrating capacitor 71 operate in reverse phase, the integrating capacitor 71 acts like a large capacitor particularly from the source terminal side of the discharging transistor 54 due to the miller effect.

Then, at time t4, when the voltage of the node VAO becomes substantially equal to the voltage of the power supply VDD, the amplification operation of the amplifier transistor 57 is stopped.

As a result, since the miller effect does not work, although the capacitance of the integrating capacitor 71 becomes the original capacitance thereof, the amount of current flowing from the integrating capacitor 71 to the select memory cell MCsel via the discharging transistor 54 does not change. Therefore, the voltage of the sense node SEN after time t4 rapidly decreases.

Along with this, the voltage of the voltage shift capacitor 72, that is, the voltage of the sense node SEN2 after time t4, also rapidly decreases.

Thereafter, at time t5, the voltage becomes substantially constant.

Therefore, during a period from time t4 to time t5, along with the change in voltage of the integrating capacitor 71, the voltage of the sense node SEN2, which is the voltage of the input terminal of the comparator 60, also changes sharply.

Therefore, the memory control circuit 33B determines whether a predetermined determination timing has been reached. When it is determined that the predetermined determination timing has not yet been reached, the memory control circuit 33B enters a standby state. When it is determined that the predetermined determination timing has been reached, the output of the comparator 60 is latched in the data register 36, and the process is ended.

[3.2] Case where the threshold voltage Vthmcx programmed in the select memory cell MCsel is higher than the identification threshold voltage VreadXX set in the word line WL (Vthmcx>VreadXX)

Next, descriptions will be made on a case where the threshold voltage programmed in the select memory cell MCsel is higher than the identification threshold voltage VreadXX set in the word line WL.

As illustrated in part (B) of FIG. 13, at time t3 (>time t2), after the voltage of the sense node SEN2 drops to about the threshold voltage of the amplifier transistor 57+the voltage of the power supply VDD, even when the threshold voltage programmed in the select memory cell MCsel is higher than the identification threshold voltage VreadXX set in the word line WL and the select memory cell MCsel is put in an off state to decrease the current ICELL, a current flows from the integrating capacitor 71 and the voltage shift capacitor 72 toward the select memory cell MCsel, the voltage across the voltage shift capacitor 72 gradually decreases, and the source-drain current of the amplifier transistor 57 gradually increases.

However, the current flowing through the select memory cell MCsel that is an off-cell is smaller than the current flowing through the select memory cell MCsel that is an on-cell.

Therefore, as indicated by a solid line SEN2 OFF in part (B) of FIG. 13, the drop of the voltage of the sense node SEN2, that is, the gate voltage of the amplifier transistor 57, from time t1 is slower than the case where the threshold voltage programmed in the select memory cell MCsel is lower than the identification threshold voltage VreadXX set in the word line WL, and the source-drain current of the amplifier transistor 57 increases slowly. Therefore, the voltage of the node VAO increases slowly.

However, since the voltage drop of the sense node SEN and further, the voltage drop of the sense node SEN2 are slow, the voltage of the node VAO does not become substantially equal to the voltage of the power supply VDD in a predetermined determination period (after time t5). Therefore, during the predetermined determination period, the amplification operation of the amplifier transistor 57 is continued. As a result, the miller effect continues to work and the apparent capacitance of the integrating capacitor 71 during the determination period remains larger than the actual capacitance thereof.

Therefore, the voltage of the input terminal of the comparator 60 at the subsequent stage of the sense amplifier circuit 50B does not become lower than the reference voltage Vref of the comparator 60 during the determination period.

That is, in the predetermined determination period (preferably after time t5), it is possible to determine the threshold voltage programmed in the select memory cell MCsel and further, the state of the select memory cell MCsel without being affected by the operation variation of the comparator 60 provided corresponding to each bit line BL.

Therefore, it is determined whether the predetermined determination timing has been reached (S17). When it is determined in S17 that the predetermined determination timing has not yet been reached ("No" in S17), the memory control circuit 33B enters a standby state.

When it is determined in S17 that the predetermined determination timing has been reached ("Yes" in S17), the output of the comparator 60 is latched in the data register 36 (S18), and the process is ended.

As described above, according to the third embodiment, even when the potential VSC of the source line of the memory cell MC is set to be higher than the potential of the low potential side power supply VSS of the first embodiment, it is possible to effectively significantly increase the gain of the sense amplifier circuit, thereby reducing the influence of operation variation of the comparator 60 at the subsequent stage of a sense amplifier circuit. Particularly, it is possible to improve the reliability of cell data of memory cells capable of storing multi-bit information in one cell such as TLC, QLC or the like.

For example, in the above description, the integrating capacitors 51, 51P and 71 are used as a first capacitive element, the capacitor constituting the clock voltage circuit 70 is used as a second capacitive element, and the voltage shift capacitor 72 is used as a third capacitive element. However, the capacitive elements are not limited to capacitors. Examples of such capacitive elements may include a varicap diode, an FET (Field Effect Transistor) and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sense amplifier circuit comprising:
   an amplifier having a terminal connected to a sense node electrically connected to a bit line of a memory cell; and
   a first capacitor configured to be connected in a feedback path of the amplifier and to the bit line of the memory cell via the sense node, the first capacitor configured to supply a current to the memory cell and integrate the current when the memory cell is read.

2. The sense amplifier circuit according to claim 1, wherein a voltage higher than a low potential side of a power supply voltage is applied to a source terminal of the memory cell,
   the sense amplifier circuit further comprising:
   a voltage application circuit configured to apply a voltage to the sense node to shift a voltage of the sense node to a high potential side of the power supply voltage; and
   a bias booster circuit configured to boost a power supply voltage and supply the boosted power supply voltage to the amplifier.

3. The sense amplifier circuit according to claim 2, wherein the voltage application circuit includes a second capacitor configured to shift the voltage of the sense node to the high potential side of the power supply voltage, the second capacitor includes a terminal connected to the sense node.

4. The sense amplifier circuit according to claim 1, wherein the amplifier includes a P-channel MOS transistor having a gate terminal connected to the sense node, a source terminal connected to a high potential side of the power supply, and a drain terminal connected to the first capacitor.

5. The sense amplifier circuit according to claim 1, wherein a voltage higher than a low potential side of a power supply is applied to a source terminal of the memory cell,
   the sense amplifier circuit further comprising:
   a third capacitor having a first terminal connected to the first capacitor via the sense node and a second terminal connected to the terminal of the amplifier, the second terminal being an output terminal; and
   a coupling-up circuit configured to cause a voltage of the sense node to be higher than a voltage of a high potential side of the power supply via the third capacitor when the memory cell is read.

6. The sense amplifier circuit according to claim 5, wherein the amplifier includes a P-channel MOS transistor having a gate terminal connected to the second terminal of the third capacitor, a source terminal connected to the high potential side of the power supply, and a drain terminal connected to the low potential side of the power supply.

7. A semiconductor memory device comprising:
   a plurality of memory cells connected to a word line;
   a plurality of sense amplifier circuits respectively connected to any one of the memory cells; and
   a plurality of comparators respectively connected to output terminals of the plurality of sense amplifier circuits,
   wherein each of the sense amplifier circuits includes:
   an amplifier having a terminal connected to a sense node electrically connected to a bit line of one of the memory cells; and
   a first capacitor connected in a feedback path of the amplifier and to the bit line of the one of the memory cells via the sense node, wherein the first capacitor is configured to supply a current to the memory cell and integrate the current when the memory cell is read.

8. The semiconductor memory device according to claim 7, wherein a voltage higher than a low potential side of a power supply voltage is applied to a source terminal of the memory cell, and
   each of the sense amplifier circuits further includes:
   a voltage application circuit configured to apply a voltage to the sense node to shift a voltage of the sense node to a high potential side of the power supply; and
   a bias booster circuit configured to boost a power supply voltage and supply the boosted power voltage to the amplifier.

9. The semiconductor memory device according to claim 8, wherein the voltage application circuit includes a second capacitor configured to shift the voltage of the sense node to the high potential side of the power supply voltage, the second capacitor includes a terminal connected to the sense node.

10. The semiconductor memory device according to claim 7, wherein the amplifier includes a P-channel MOS transistor having a gate terminal connected to the sense node, a source terminal connected to a high potential side of the power supply, and a drain terminal connected to the first capacitor.

11. The semiconductor memory device according to claim 7, wherein a voltage higher than a low potential side of a power supply is applied to a source terminal of the memory cell, and
   each of the sense amplifier circuits further includes:
   a third capacitor having a first terminal connected to the sense node and a second terminal connected to the terminal of the amplifier, the second terminal beings an output terminal; and a coupling-up circuit configured to cause a voltage of the sense node to be higher than a high potential side of the power supply via the third capacitor when the memory cell is read.

12. The semiconductor memory device according to claim 11, wherein the amplifier includes a P-channel MOS transistor having a gate terminal connected to the second terminal of the third capacitor, a source terminal connected to the high potential side of the power supply, and a drain terminal connected to the low potential side of the power supply.

* * * * *